US008749232B2

(12) United States Patent
Fu et al.

(10) Patent No.: US 8,749,232 B2
(45) Date of Patent: Jun. 10, 2014

(54) MAGNATORESISTIVE SENSING COMPONENT AND AGNATORESISTIVE SENSING DEVICE

(71) Applicants: Nai-Chung Fu, Zhongli (TW); Kuang-Ching Chen, Beidou Township (TW); Fu-Tai Liou, Zhubei (TW)

(72) Inventors: Nai-Chung Fu, Zhongli (TW); Kuang-Ching Chen, Beidou Township (TW); Fu-Tai Liou, Zhubei (TW)

(73) Assignee: Voltafield Technology Corp, Zhubei (TW)

( * ) Notice: Subject to any disclaimer, the term of this patent is extended or adjusted under 35 U.S.C. 154(b) by 67 days.

(21) Appl. No.: 13/625,009

(22) Filed: Sep. 24, 2012

(65) Prior Publication Data
US 2013/0082699 A1 Apr. 4, 2013

(30) Foreign Application Priority Data

Sep. 29, 2011 (TW) .............................. 100135263 A
Sep. 4, 2012 (TW) .............................. 101132202 A

(51) Int. Cl.
*G01R 33/02* (2006.01)
(52) U.S. Cl.
USPC ........................................................ 324/252
(58) Field of Classification Search
USPC ........................................................ 324/252
See application file for complete search history.

(56) References Cited

U.S. PATENT DOCUMENTS

| 4,580,175 A * | 4/1986 | Mowry et al. ............ 360/327.11 |
| 5,561,368 A | 10/1996 | Dovek et al. |
| 6,174,737 B1 | 1/2001 | Durlam et al. |
| 2004/0137681 A1 | 7/2004 | Motoyoshi |
| 2011/0163746 A1* | 7/2011 | Zimmer et al. ............... 324/252 |
| 2011/0244599 A1 | 10/2011 | Whig et al. |

FOREIGN PATENT DOCUMENTS

TW 331592 5/1998

* cited by examiner

*Primary Examiner* — Reena Aurora
(74) *Attorney, Agent, or Firm* — Alan Kamrath; Kamrath IP Lawfirm, P.A.

(57) ABSTRACT

A magnetoresistive sensing component includes a strip of horizontal magnetoresistive layer, a conductive part and a first magnetic-field-sensing layer. The strip of horizontal magnetoresistive layer is disposed above a surface of a substrate and has a first side and a second side opposite the first side along its extending direction. The conductive part is disposed above or below the horizontal magnetoresistive layer and electrically coupled to the horizontal magnetoresistive layer. The conductive part and the horizontal magnetoresistive layer together form at least an electrical current path. The first magnetic-field-sensing layer is not parallel to the surface of the substrate and magnetically coupled to the horizontal magnetoresistive layer at the first side of the horizontal magnetoresistive layer.

30 Claims, 14 Drawing Sheets

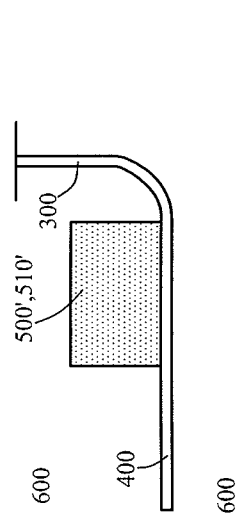
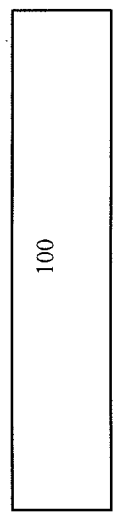
FIG. 4A
FIG. 4B
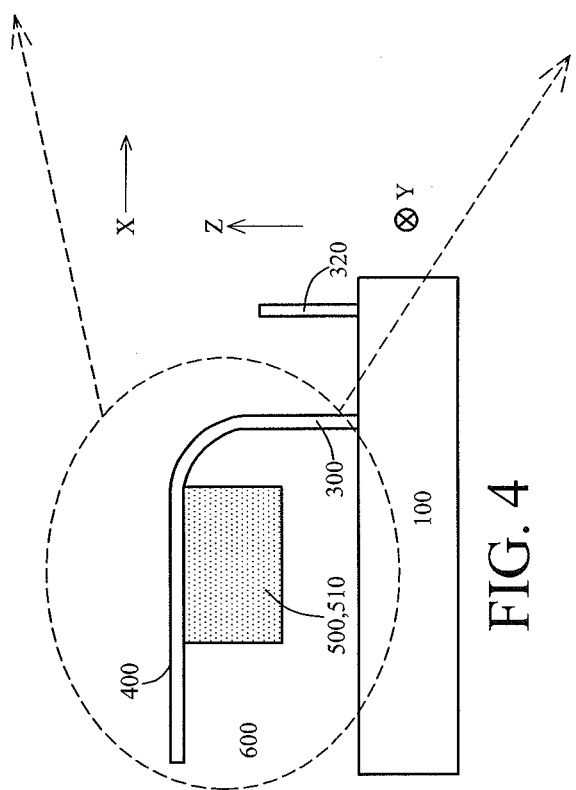
FIG. 4

MAGNATORESISTIVE SENSING COMPONENT AND AGNATORESISTIVE SENSING DEVICE

FIELD OF THE INVENTION

The present invention relates to a magnetoresistive sensing component and a magnetoresistive sensing device, particularly to a magnetoresistive sensing component capable of sensing an external magnetic field perpendicular to the substrate surface. The magnetoresistive sensing component of this invention can be integrated with a magnetoresistive sensing component capable of sensing an external magnetic field parallel to the substrate surface within the same chip.

BACKGROUND OF THE INVENTION

The magnetoresistive materials used in a magnetoresistive sensing component would change its resistance according to a change of an external magnetic field. This kind of material is popular for sport equipments, automobile, motors and communication products. Common magnetoresistive materials can be categorized into anisotropic magnetoresistive material (AMR), giant magnetoresistive material (GMR) and tunneling magnetoresistive material (TMR) according to how they function and their sensitivities.

So far a magnetoresistive sensing device capable of sensing changes of X-axis, Y-axis and Z-axis magnetic fields still requires integration of multiple magnetoresistive sensing devices sensing magnetic fields of different directions by package despite the magnetoresistive material used. This would cause high cost, low device yield and package complexity.

SUMMARY OF THE INVENTION

The object of this invention is to provide a magnetoresistive sensing component capable of sensing an external magnetic field perpendicular to the substrate surface. The material and fabricating process of this magnetoresistive sensing component put it in a advantageous position to be integrated with magnetoresistive sensing components capable of sensing an external magnetic field parallel to the substrate surface within the same chip.

The present invention provides a magnetoresistive sensing component comprising a strip of horizontal magnetoresistive layer, a conductive part and a first magnetic-field-sensing layer. The strip of horizontal magnetoresistive layer is disposed above a surface of a substrate and has a first side and a second side opposite the first side along its extending direction. The conductive part is disposed above or below the horizontal magnetoresistive layer and electrically coupled to the horizontal magnetoresistive layer. The conductive part and the horizontal magnetoresistive layer together form at least an electrical current path. The first magnetic-field-sensing layer is not parallel to the surface of the substrate and magnetically coupled to the horizontal magnetoresistive layer at the first side of the horizontal magnetoresistive layer.

In one embodiment of the present invention, the conductive part comprises multiple conductive strips, an extending direction of these multiple conductive strips forms an acute angle with respect to the extending direction of the horizontal magnetoresistive layer.

In one embodiment of the present invention, the first magnetic-field-sensing layer is a long strip extending upwards or downwards from the first side of the horizontal magnetoresistive layer.

In one embodiment of the present invention, the first magnetic-field-sensing layer comprises multiple discrete sub-portions extending upwards or downwards from the first side of the horizontal magnetoresistive layer.

In one embodiment of the present invention, the conductive part comprises multiple conductive portions of the first side extending from the first side towards the second side and multiple conductive portions of the second side extending from the second side towards the first side.

In one embodiment of the present invention, the component further comprises a second magnetic-field-sensing layer not parallel to the surface of the substrate and magnetically coupled to the horizontal magnetoresistive layer at the second side of the horizontal magnetoresistive layer. The second magnetic-field-sensing layer comprises multiple discrete sub-portions extending upwards or downwards from the second side of the horizontal magnetoresistive layer.

In one embodiment of the present invention, the multiple discrete sub-portions of the first magnetic-field-sensing layer and the multiple discrete sub-portions of the second magnetic-field-sensing layer are alternatively disposed along the extending direction of the horizontal magnetoresistive layer.

In one embodiment of the present invention, the multiple conductive portions of the first side and the multiple conductive portions of the second side are disposed alternatively or symmetrically along the extending direction of the horizontal magnetoresistive layer.

The present invention also provides a magnetoresistive sensing device comprising a Wheatstone bridge structure. The Wheatstone bridge structure comprises four resistive arms and each resistive arm comprises the magnetoresistive sensing component of the present invention.

BRIEF DESCRIPTION OF THE DRAWINGS

FIG. 4 shows the schematic cross section views taken along lines A-A', B-B' and D-D' of FIG. 1, FIG. 2 and FIG. 3 respectively.

FIG. 4A shows another embodiment of the cross section shown in FIG. 4.

FIG. 4B shows another embodiment of the cross section shown in FIG. 4.

DETAILED DESCRIPTION OF THE INVENTION

Figure 1:
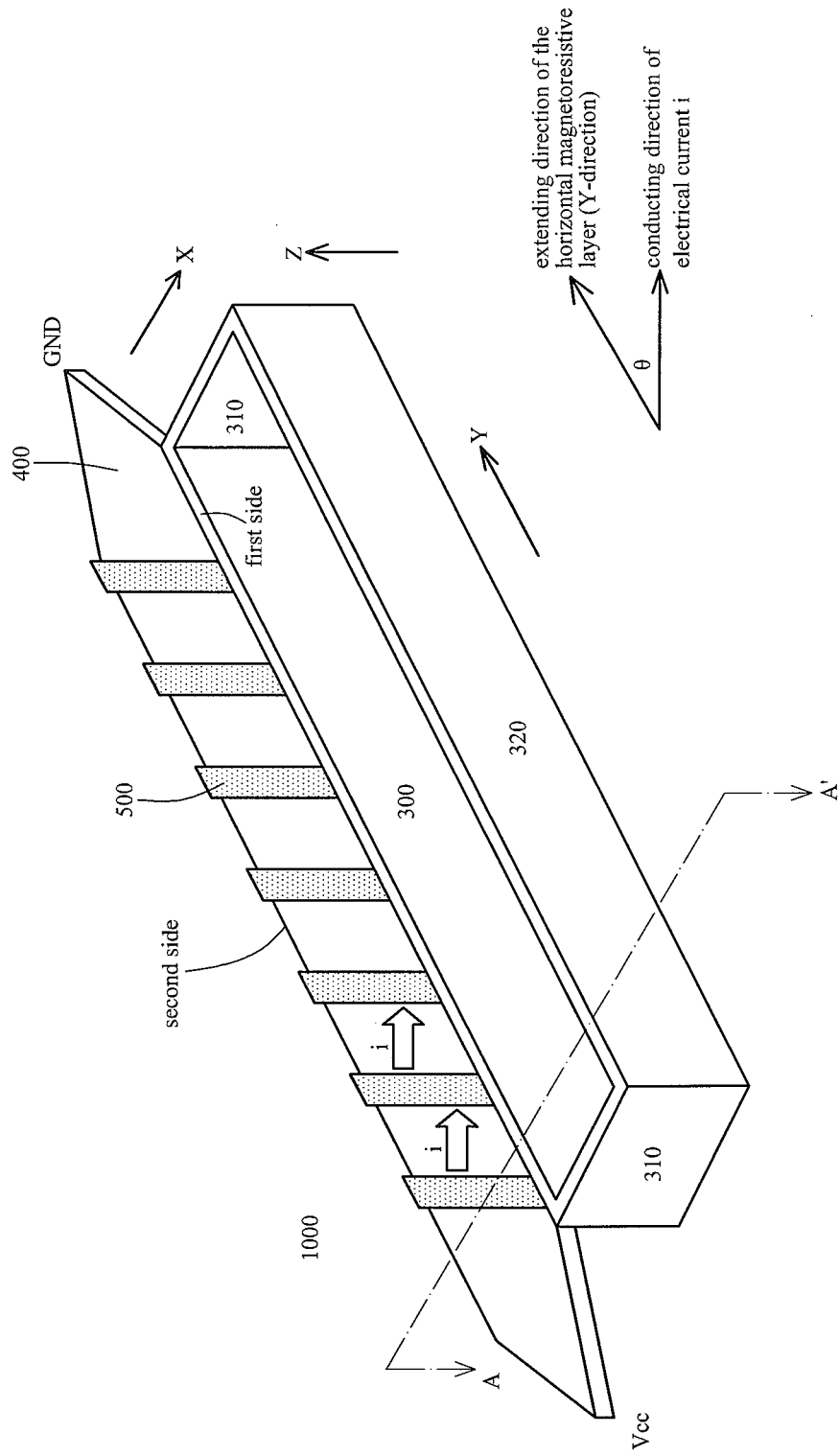
FIG. 1 shows the schematic three-dimensional view of the Z-axis magnetoresistive sensing component according to one embodiment of the present invention.

The present invention focuses on a magnetoresistive sensing component and a magnetoresistive sensing device, particularly the magnetoresistive sensing device capable of sensing an external magnetic field perpendicular to the substrate surface. However, the magnetoresistive sensing device of the present invention may further comprise other common structures such as set/reset circuit, magnetoresistive sensing components capable of sensing X-axis and/or Y-axis magnetic field, various kinds of circuitries such as amplifier, filter, converter . . . etc., shield for shielding unwanted electrical and/or magnetical signals. To explain the present invention clearly and completely without obscurity, the commonly used structures are simply put without detailed descriptions. It is noted that the magnetoresistive sensing device of the present invention can optionally adopt these structures.

The following descriptions illustrate preferred embodiments of the present invention in detail. All the components, sub-portions, structures, materials and arrangements therein can be arbitrarily combined in any sequence despite their belonging to different embodiments and having different sequence originally. All these combinations are falling into the scope of the present invention. A person of ordinary skills in the art, upon reading the present invention, can change and modify these components, sub-portions, structures, materials and arrangements therein without departing from the spirits and scope of the present invention. These changes and modifications should fall in the scope of the present invention defined by the appended claims.

There are a lot of embodiments and figures within this application. To avoid confusions, similar components are designated by the same or similar numbers. To simplify figures, repetitive components are only marked once. The purpose of figures is to convey concepts and spirits of the present invention, so all the distances, sizes, scales, shapes and connections are explanatory and exemplary but not realistic. Other distances, sizes, scales, shapes and connections that can achieve the same functions or results in the same way can be adopted as equivalents.

In the context of the present invention, "magnetic-field-sensing layer" or "magnetic-field-guiding layer" is composed by magnetic materials and "magnetoresistive layer" is also composed by magnetic materials, especially discrete or continuous single layer or multiple layers whose resistance would change according to a change of an external magnetic field. For example, the magnetic material may comprise an anisotropic magnetoresistive material (AMR), a giant magnetoresistive material (GMR) and a tunneling magnetoresistive material (TMR), a ferromagnet material, an antiferromagnet material, a nonferromagnet material or a tunneling oxide or any combination thereof. "Magnetic-field-sensing layer" or "magnetoresistive layer" or "magnetic-field-guiding layer" preferably comprises anisotropic magnetoresistive material (AMR) especially Permalloy. In the context of the present invention, the descriptive term "sensing" or "guiding" added before elements is used to explain certain function/effect performed/achieved by such elements when the magnetoresistive sensing component senses an external magnetic field of a specific direction. When a change occurs to the direction of the external magnetic field (for example becoming opposite direction), the function/effect performed/achieved by such elements may change or switch. Therefore, the descriptive term "sensing" or "guiding" added before elements should not limit the function/effect of such elements. In the context of the present invention, the term "conductive strips", "conductive part" or "interconnect" represents a conductive structure with any shape capable of conducting electricity. It may comprise a metal, an alloy, a silicide, nanotubes, a conductive carbon material, doped silicon. As its structure, it may take a form of strip, concrete islands, sheet, via, single damascene or dual damascene structures, or a combination thereof along horizontal or vertical direction. In the context of the present invention, the term "magnetic field" or "magnetic field of a specific direction" represents a net magnetic field at a specific location taking effect of magnetic fields from different sources or a magnetic field at a specific location from a specific source without considering other sources or a magnetic component of a specific direction. In the context of the present invention, the phrase "A is magnetically coupled to B" means magnetic flux lines going through one of A and B would be affected by the other of A and B, thereby redirecting or concentrating the magnetic flux lines. Therefore, the phrase "A is magnetically coupled to B" can represent a situation where A is in physical contact with B or a situation where A and B are close enough to magnetically affect each other without physically contacting each other. In the context of the present invention, the phrase "A is electrically coupled to B" means electrical current can flow from one of A and B to the other of A and B, so "A is electrically coupled to B" can represent a situation where A is in physical contact with B or a situation where there is one or more conductive structure/substance between A and B so as to make electrical communication occurs between A and B.

Now please refer to FIG. 1 and FIG. 4. FIG. 1 shows the schematic three-dimensional view of the Z-axis magnetoresistive sensing component according to one embodiment of the present invention. FIG. 4 shows the schematic cross section views taken along lines A-A' of FIG. 1. FIG. 1 focuses on the shape and orientation of each element of Z-axis magnetoresistive sensing component 1000. FIG. 4-4B focus on the primary elements involved in sensing an external magnetic field of Z-direction (hereafter it is referred to as Z-axis magnetic field). Z-axis magnetoresistive sensing component 1000 primarily comprises a horizontal magnetoresistive layer 400, a magnetic-field-sensing layer 300 not parallel to a surface of the substrate and a conductive part 500. The strip of horizontal magnetoresistive layer 400 is disposed above the surface of the substrate 100 and parallel thereto. The strip of horizontal magnetoresistive layer 400 extends along the direction of Y (hereafter it is referred to as Y-direction) and takes a form of long narrow thin sheet without limitations on the shape of its ends. The horizontal magnetoresistive layer 400 along its extending direction (Y direction) has two long sides, first side close to the direction of +X (hereafter it is referred to as X-direction) and a second side opposite to the first side. One end of the strip of horizontal magnetoresistive layer 400 is electrically coupled to working voltage (Vcc) and the other end is electrically coupled to ground (GND). The magnetic-field-sensing layer 300 not parallel to the substrate surface is also disposed above the substrate and almost perpendicular to the substrate surface. The magnetic-field-sensing layer 300 can be designed to be a slant or a combination of multiple slants, that is, not parallel to the substrate surface. Even though FIG. 1 takes vertical as example, the present invention is not limited thereto. The magnetic-field-sensing layer 300 extends downwards from the first side of the horizontal magnetoresistive layer 400 and magnetically coupled thereto, so as to redirect/guide the Z-axis magnetic field felt by the horizontal magnetoresistive layer 400 to the magnetic-field-sensing layer 300. This would cause a change of the resistance of the Z-axis magnetoresistive sensing component 1000, resulting in a change of the output voltage. The horizontal magnetoresistive layer 400 and magnetic-field-sensing layer 300 may be formed from the same magnetoresistive material in one structure, or may be formed from the same or different magnetoresistive materials separately into physically connected separate structures, or may be formed from the same or different magnetoresistive materials separately into physically separated discrete structures. When same material is used, different thicknesses can be adopted according to design requirements. The horizontal magnetoresistive layer 400 and magnetic-field-sensing layer 300 can be physically separated as long as they are close enough to magnetically affect each other. In this embodiment, the magnetic-field-sensing layer 300 takes a form of a portion of a magnetoresistive layer on the sidewall of a downward trench and this makes it a long thin strip. The rest of the magnetoresistive layer on the sidewall of the downward trench comprises two connecting magnetoresistive layers 310 physically connected to the magnetic-field-sensing layer 300 and a opposite magnetoresistive layer 320 physically connected to the two connecting magnetoresistive layers 310. Nonetheless, connecting magnetoresistive layer 310 and opposite magnetoresistive layer 320 do not contribute to Z-axis magnetic field sensing, they are not discussed further.

The conductive part 500 is disposed above or below the horizontal magnetoresistive layer 400 to electrically or physically contact the horizontal magnetoresistive layer 400. The extending direction of the conductive part 500 is not parallel to the extending direction of the horizontal magnetoresistive layer 400. Therefore, the conductive part 500 serves as a shunt to change a direction of the current flowing in the magnetoresistive layer (thereafter "direction of the current" is referred to "current direction"), so the current direction in the magnetoresistive layer forms an angle with respect to a direction of the magnetization of the magnetoresistive layer (thereafter "direction of the magnetization" is referred to "magnetization direction"), thereby increasing sensitivity of the magnetoresistive layer. In this embodiment, multiple conductive parts 500 have the same width, have the same distance between the adjacent ones, and all form an acute angle with respect to the extending direction of the horizontal magnetoresistive layer 400 (Y-direction). Preferably, the extending direction of the conductive parts 500 forms 45 degree angle with respect to the extending direction of the horizontal magnetoresistive layer 400 (Y-direction). Since the conductive part 500 adopts one or more conductive metals as its material, its resistivity is far smaller than the resistivity of the magnetoresistive material adopted by the horizontal magnetoresistive layer 400. Hence, in the area where the conductive part 500 is in physical contact with the horizontal magnetoresistive layer 400 electrical current would take the conductive part 500 with smaller resistivity as its conducting path; within the horizontal magnetoresistive layer 400 (that is the area between adjacent conductive parts 500) electrical current i would take the shortest distance between the adjacent conductive parts 500 as its conducting path. The horizontal magnetoresistive layer 400 and the conductive part 500 together form a conducting path: the horizontal magnetoresistive layer 400→the conductive part 500→the horizontal magnetoresistive layer 400 between adjacent conductive parts 500→the next conductive part 500 . . . . Since multiple conductive parts 500 have the same shape, the same width, the same orientation and have the same distance between the adjacent ones, the electrical currents between the adjacent conductive parts 500 flow along the same direction and this conducting direction forms an angle θ with respect to the extending direction of the horizontal magnetoresistive layer 400 (Y-direction).

In FIG. 4, the horizontal magnetoresistive layer 400, conductive part 500, magnetic-field-sensing layer 300 and opposite magnetoresistive layer 320 are all disposed within the dielectric layer 600 above the substrate 100, but in the final product there may be other dielectric layers covering the horizontal magnetoresistive layer 400 and protecting other elements or circuitry. The dielectric layer 600 may be a single or multiple films of any dielectric materials. Also, although in FIG. 4 the magnetic-field-sensing layer 300 is shown to be in physical contact with the substrate 100, it is noted that the substrate shown in all the figures of the present invention may comprise a base substrate and all the active devices, passive devices, circuitry, doped region, interconnects between the base substrate and Z-axis magnetoresistive sensing components. The term "substrate" is not limited to the well known glass, silicon or plastic carriers. The descriptions of dielectric layer 600 and substrate 100 can be equally applied to FIGS. 4A, 4B, 5, 7A, 7B, 8A, 8B, the descriptions are omitted in the following content to save repetitions.

Then please refer to FIG. 4A. FIG. 4A shows another embodiment of the cross section shown in FIG. 4. The difference between FIG. 4A and FIG. 4 is that the conductive parts 500' of FIG. 4A are rather disposed above the horizontal magnetoresistive layer 400 than below the horizontal magnetoresistive layer 400 and magnetic-field-sensing layer 300' of FIG. 4A rather extends upwards from the first side of the horizontal magnetoresistive layer 400 than downwards. The horizontal magnetoresistive layer 400 and magnetic-field-sensing layer 300' of FIG. 4A may be at the bottom and sidewall of a trench respectively, but they may have other layouts achieved by other fabricating processes.

Then please refer to FIG. 4B. FIG. 4B also shows another embodiment of the cross section shown in FIG. 4. The difference between FIG. 4B and FIG. 4 is that in FIG. 4B the horizontal magnetoresistive layer 400 and magnetic-field-sensing layer 300 are not physical connected at the original turning/joining corner. This can be caused by various reasons such as special design concern, the magnetoresistive material suffering from thinner thickness at turning corner due to poor deposition process, misalignment due to poor lithography process, or over etching the turning corner. Even though the horizontal magnetoresistive layer 400 and magnetic-field-sensing layer 300 are no longer physically connected together, they should be close enough in position to render magnetic influence to each, thereby keeping the Z-axis magnetoresistive sensing component operate properly.

Although in this spec the inventors provide modified embodiments, FIG. 4A and FIG. 4B, only for the cross section view of FIG. 4, it is noted that the modified embodiments, FIG. 4A and FIG. 4B, can be equally applied to the first side or second side of all the Z-axis magnetoresistive sensing components 1000', 1200, 1300, 1400, 1500, 1600 of the present invention. The horizontal magnetoresistive layer 400, magnetic-field-sensing layer 300/300', conductive part 500/500' and conductive part 510/510' (to be explained later) can be combined in any way and any other. For example: conductive part 500'/510' of FIG. 4A may be disposed below the horizontal magnetoresistive layer 400; conductive part 500/

510 may be disposed above the horizontal magnetoresistive layer 400; the horizontal magnetoresistive layer 400 and magnetic-field-sensing layer 300 of FIG. 4A may be physically separated. Also, although the magnetic-field-sensing layer 300/300' and horizontal magnetoresistive layer 400 shown in FIGS. 4, 4A and 4B have uniform thickness, it is possible the magnetic-field-sensing layer 300/300' and horizontal magnetoresistive layer 400 may have different thicknesses and/or materials and the thickness of magnetic-field-sensing layer 300/300' may along vertical direction to optimize performances of the components.

Figure 2:
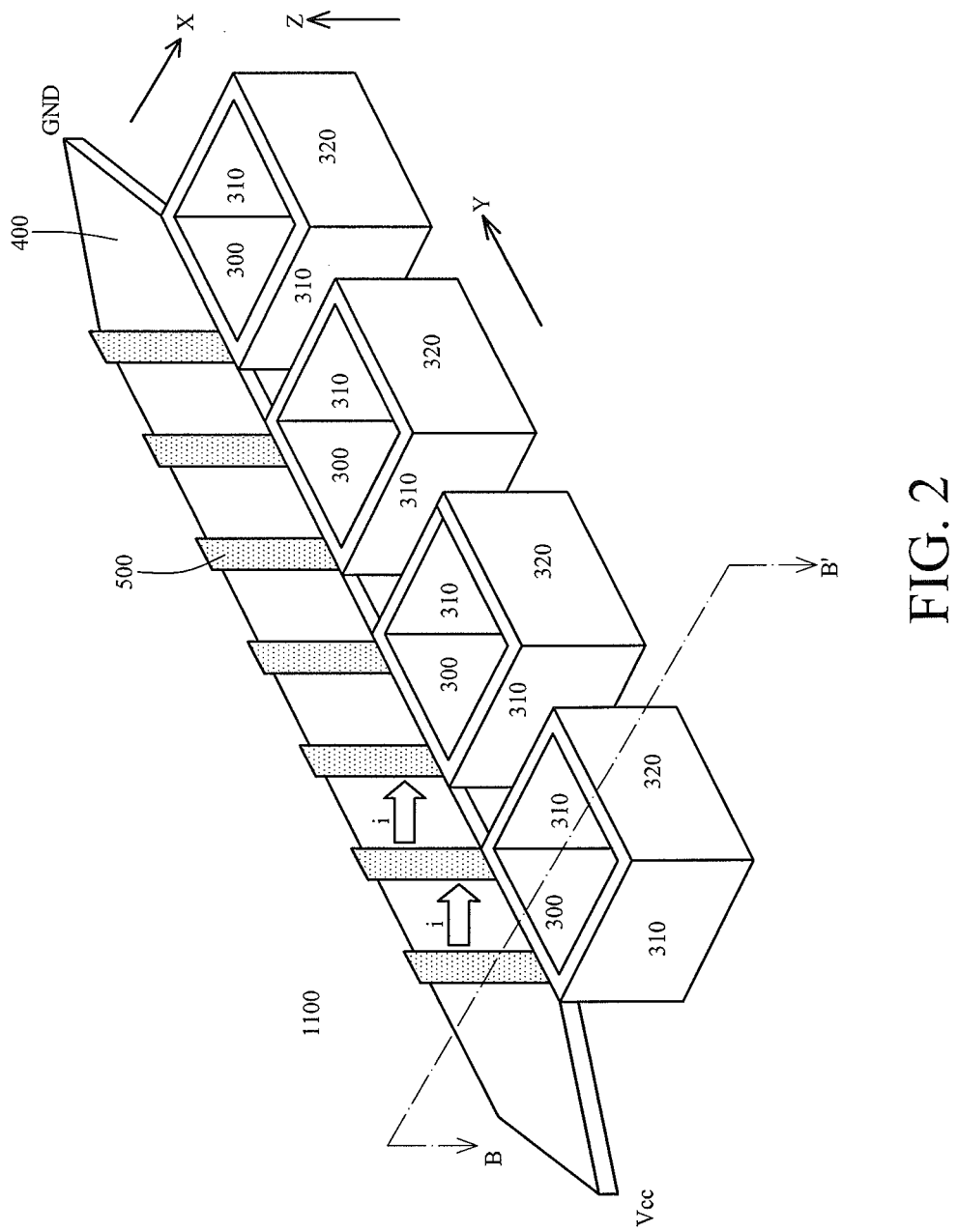
FIG. 2 shows the schematic three-dimensional view of the Z-axis magnetoresistive sensing component according to another embodiment of the present invention.

Then please refer to FIG. 2. FIG. 2 shows the schematic three-dimensional view of the Z-axis magnetoresistive sensing component 1100 according to another embodiment of the present invention. Z-axis magnetoresistive sensing component 1100 shares the same operational principle with Z-axis magnetoresistive sensing component 1000 of FIG. 1 and the cross section view taken along line B-B' is the same one shown in FIG. 4. The shapes, materials, orientations, relative positions of the horizontal magnetoresistive layer 400 and conductive part 500 and conducting path and direction of the electrical current are the same for Z-axis magnetoresistive sensing component 1100 and 1000, so here only the differences are addressed. In this embodiment, the magnetic-field-sensing layer 300 is almost perpendicular to the substrate surface and extends downwards from the first side of the horizontal magnetoresistive layer 400. The magnetic-field-sensing layer 300 comprises multiple discrete sub-portions and each sub-portion takes a form of a portion of a magnetoresistive layer on the sidewall of a downward trench, so there are multiple downward trenches accommodate the multiple discrete sub-portions of the magnetic-field-sensing layer 300 respectively. The rest of the magnetoresistive layer on the sidewall of each downward trench comprises two connecting magnetoresistive layers 310 physically connected to the magnetic-field-sensing layer 300 and a opposite magnetoresistive layer 320 physically connected to the two connecting magnetoresistive layers 310. Nonetheless, connecting magnetoresistive layer 310 and opposite magnetoresistive layer 320 do not contribute to Z-axis magnetic field sensing, they are not discussed further. Preferably, each downward trench has the same size, depth, sidewall slope, so each discrete sub-portion of the magnetic-field-sensing layer 300 has approximately the same area and thickness. Preferably, the distances between the adjacent downward trenches are the same. The magnetic-field-sensing layer 300 of this invention looks different from the magnetic-field-sensing layer 300 of FIG. 1, however the material (same as the horizontal magnetoresistive layer 400 or different from the horizontal magnetoresistive layer 400), the way of coupling to the horizontal magnetoresistive layer 400 (magnetically coupled) and operational principle (feeling Z-axis magnetic field and redirect/guide it to the horizontal magnetoresistive layer 400) for the magnetic-field-sensing layer 300 of this embodiment is basically the same as the one in FIG. 1.

Figure 3:
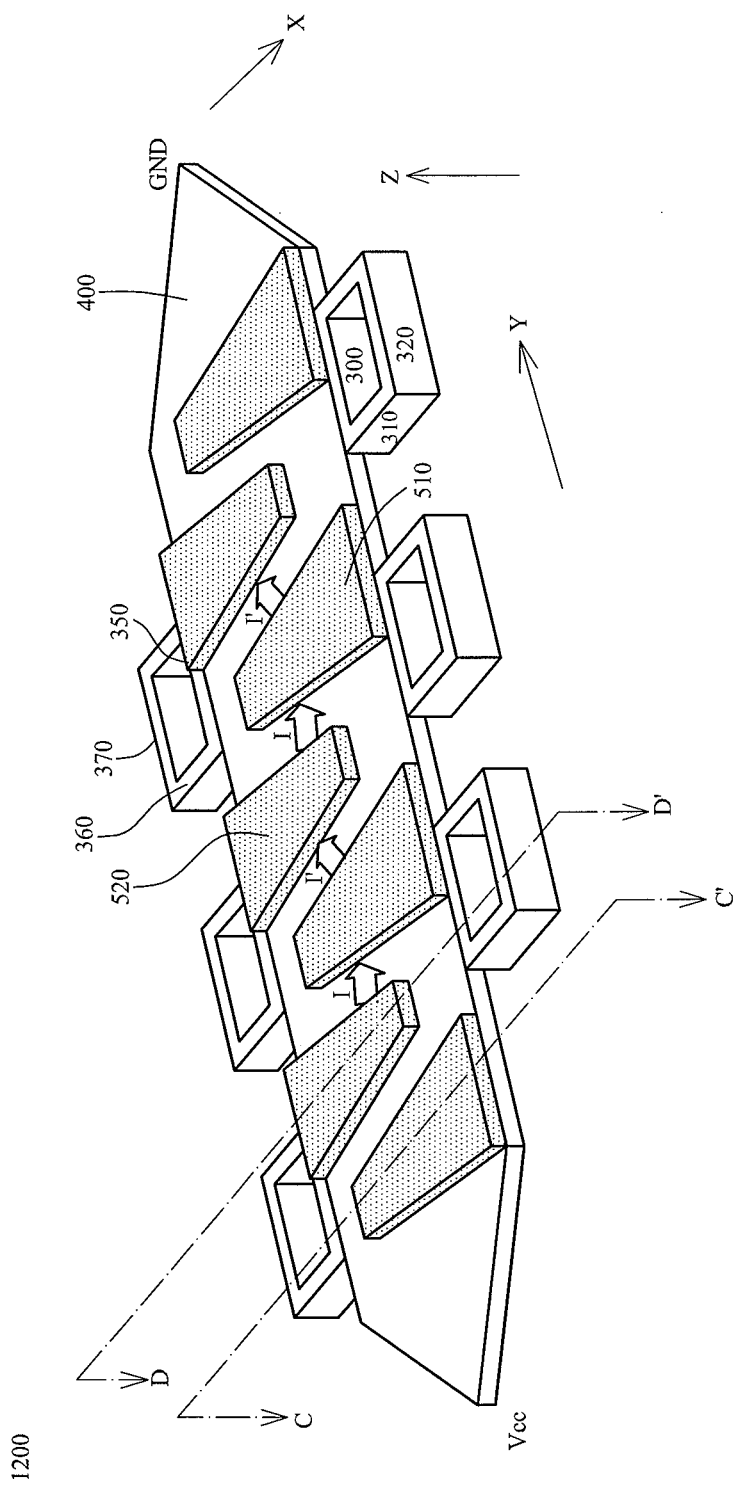
FIG. 3 shows the schematic three-dimensional view of the Z-axis magnetoresistive sensing component according to another embodiment of the present invention.
Figure 3A:
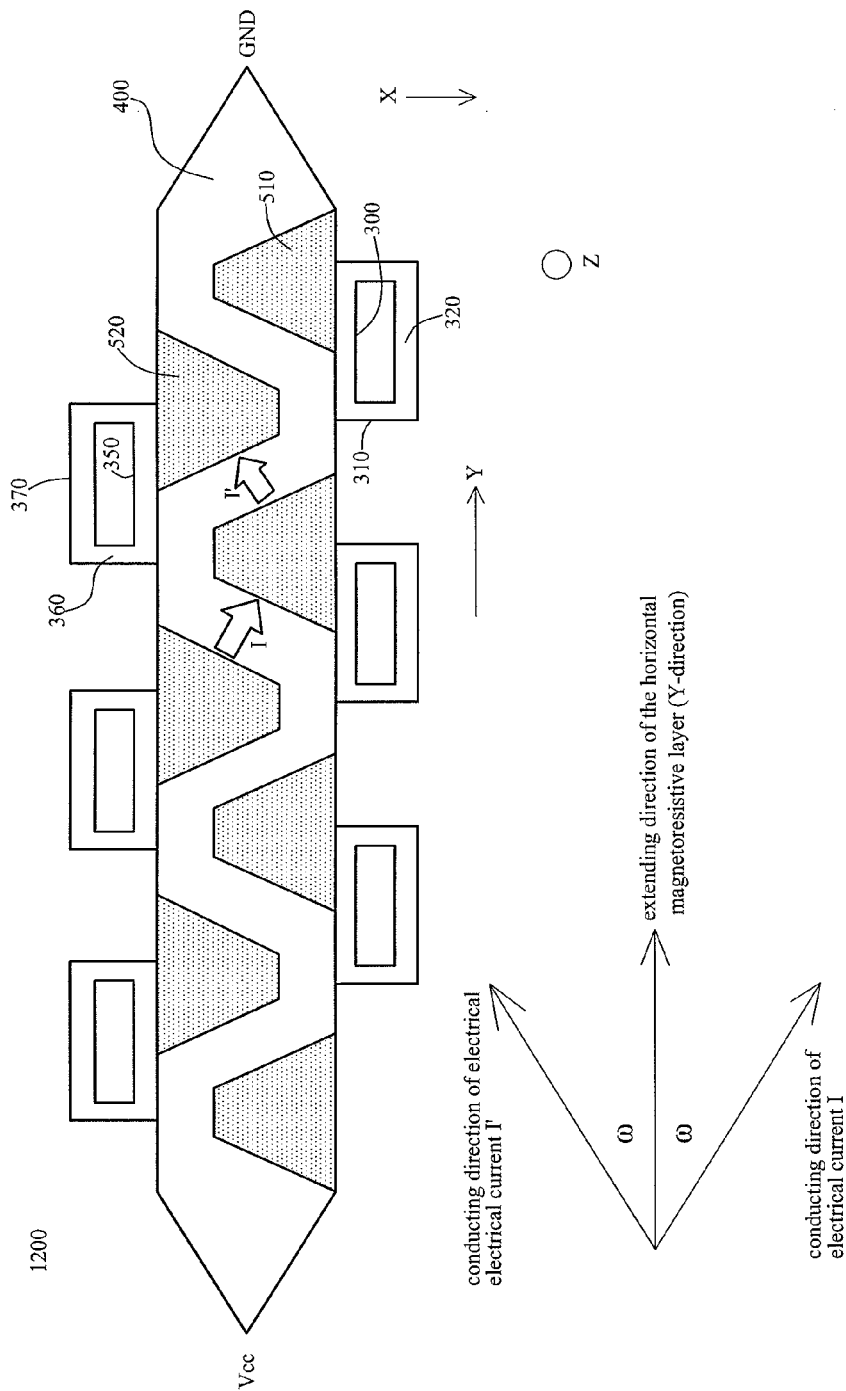
FIG. 3A shows the top view of the Z-axis magnetoresistive sensing component of FIG. 3.

Now please refer to FIG. 3 and FIG. 3A. They show the schematic three-dimensional view and top view of the Z-axis magnetoresistive sensing component 1200 according to another embodiment of the present invention. Z-axis magnetoresistive sensing component 1200 primarily comprises a horizontal magnetoresistive layer 400, a magnetic-field-sensing layer 300 of the first side not parallel to the substrate substrate (hereafter referred to as magnetic-field-sensing layer 300), a magnetic-field-sensing layer 350 of the second side not parallel to the substrate (hereafter referred to as magnetic-field-sensing layer 350), multiple conductive parts of the first side 510 and multiple conductive parts of the second side 520. The horizontal magnetoresistive layer 400 of this embodiment is the same as the one shown in FIG. 1 in their shape, material and orientation, so its descriptions are omitted to save repetitions.

The magnetic-field-sensing layer 300 of the first side in this embodiment is similar to the magnetic-field-sensing layer 300 shown in FIG. 2. It is almost perpendicular to the substrate surface, extends downwards from the first side of the horizontal magnetoresistive layer 400 and is magnetically coupled to the horizontal magnetoresistive layer 400. The magnetic-field-sensing layer 300 of the first side comprises multiple discrete sub-portions and each sub-portion takes a form of a portion of a magnetoresistive layer on the sidewall of a downward trench, so there are multiple downward trenches accommodate the multiple discrete sub-portions of the magnetic-field-sensing layer 300 respectively. Similarly, the rest of the magnetoresistive layer on the sidewall of each downward trench comprises two connecting magnetoresistive layers 310 physically connected to the magnetic-field-sensing layer 300 and an opposite magnetoresistive layer 320 physically connected to the two connecting magnetoresistive layers 310. In this embodiment, Z-axis magnetoresistive sensing component 1200 further comprises the magnetic-field-sensing layer 350 not parallel to the substrate surface. Similar to the magnetic-field-sensing layer 300, the magnetic-field-sensing layer 350 is almost perpendicular to the substrate surface, extends downwards from the second side of the horizontal magnetoresistive layer 400 and is magnetically coupled to the horizontal magnetoresistive layer 400. The magnetic-field-sensing layer 350 of the second side comprises multiple discrete sub-portions and each sub-portion takes a form of a portion of a magnetoresistive layer on the sidewall of a downward trench. Similarly, the rest of the magnetoresistive layer on the sidewall of each downward trench comprises two connecting magnetoresistive layers 360 physically connected to the magnetic-field-sensing layer 350 and an opposite magnetoresistive layer 370 physically connected to the two connecting magnetoresistive layers 360.

In comparison with FIG. 2, in FIG. 3 the distance between adjacent sub-portions of the magnetic-field-sensing layer 300 is farer and the distance between adjacent sub-portions of the magnetic-field-sensing layer 350 is also farer; the sub-portions of the magnetic-field-sensing layer 300 and the sub-portions of the magnetic-field-sensing layer 350 are disposed alternatively along the extending direction of the horizontal magnetoresistive layer 400 (Y-direction); the sub-portions of the magnetic-field-sensing layer 300 and the sub-portions of the magnetic-field-sensing layer 350 may partially overlap with each other or not overlap completely. Preferably, each downward trench of the first side and second side may have the same size, depth, sidewall slope, so each discrete sub-portion of the magnetic-field-sensing layer 300/350 has approximately the same area and thickness. Preferably, the distances between the adjacent downward trenches are the same. Preferably, the distances between the adjacent downward trenches of the first/second side are the same.

The multiple conductive parts 510 of the first side extend from the first side of the horizontal magnetoresistive layer 400 toward the second side preferably reaching the second side; the multiple conductive parts 520 of the second side extend from the second side of the horizontal magnetoresistive layer 400 toward the first side preferably reaching the first side. The conductive parts 510 of the first side and the multiple conductive parts 520 of the second side may have the same shape or different shapes (same in this embodiment) and may take any shapes (trapezoid in this embodiment). In general, the conductive parts 510 of the first side usually have the same shape, size and distance between the adjacent ones, the conductive parts 520 of the second side usually have the same shape, size and distance between the adjacent ones, and the conductive parts 510 of the first side and the conductive parts 520 of the second side are disposed alternatively along the extending direction of the horizontal magnetoresistive layer 400 (Y-direction). Preferably, the conductive parts 510 of the first side and the conductive parts 520 of the second side have the same shape and size and the adjacent sides of conductive parts 510 of the first side and conductive parts 520 of the second side are parallel (one leg of the conductive part 510 of the first side is parallel to one leg of the adjacent conductive part 520 of the second side in this embodiment). Since the conductive part 510 of the first side and the adjacent conductive part 520 of the second side adopts one or more conductive metals as their materials, their resistivity is far smaller than the resistivity of the magnetoresistive material adopted by the horizontal magnetoresistive layer 400. Hence, in the area where the conductive part 510/520 is in physical contact with the horizontal magnetoresistive layer 400 electrical current would take the conductive part 510/520 with smaller resistivity as its conducting path; within the horizontal magnetoresistive layer 400 (that is the area between adjacent conductive part 510 and conductive part 520) electrical current I/I' would take the shortest distance between the adjacent conductive part 510 and conductive part 520 as its conducting path. When within the horizontal magnetoresistive layer 400 electrical current flows from the conductive part 520 to the conductive part 510, current I forms an angle +ω with respect to the extending direction of the horizontal magnetoresistive layer 400 (Y-direction). When within the horizontal magnetoresistive layer 400 electrical current flows from the conductive part 510 to the conductive part 520, current I' forms an angle −ω with respect to the extending direction of the horizontal magnetoresistive layer 400 (Y-direction). ω represents the same number and its magnitude depends on a slope of the leg of the trapezoid. +ω represents an angle deviating from a base line along clockwise direction and −ω represents an angle deviating from a base line along counterclockwise direction. The horizontal magnetoresistive layer 400 and the conductive part 510/520 together form a conducting path: the horizontal magnetoresistive layer 400→the conductive part 510→the horizontal magnetoresistive layer 400 between adjacent conductive part 510 and conductive part 520→the conductive part 520→the horizontal magnetoresistive layer 400 between adjacent conductive part 520 and conductive part 510 . . . .

Now refer to FIG. 3A. All the sub-portions of the magnetic-field-sensing layer 300 and multiple conductive parts 510 extend from the first side of the horizontal magnetoresistive layer 400. Except rare situations where the length of the horizontal magnetoresistive layer 400 would not allow, each sub-portion of the magnetic-field-sensing layer 300 corresponds to a conductive part 510 of the first side and they partially overlap at the first side. The length of overlap is preferable half length of a sub-portion of the magnetic-field-sensing layer 300 and/or half length of a base side of the conductive part 510 (half length of a base side of a trapezoid in this embodiment). Same principle can be applied to the sub-portions of the magnetic-field-sensing layer 350 and multiple conductive parts 520 extending from the second side of the horizontal magnetoresistive layer 400 (their corresponding relationship and overlap at the second side).

Figure 5:
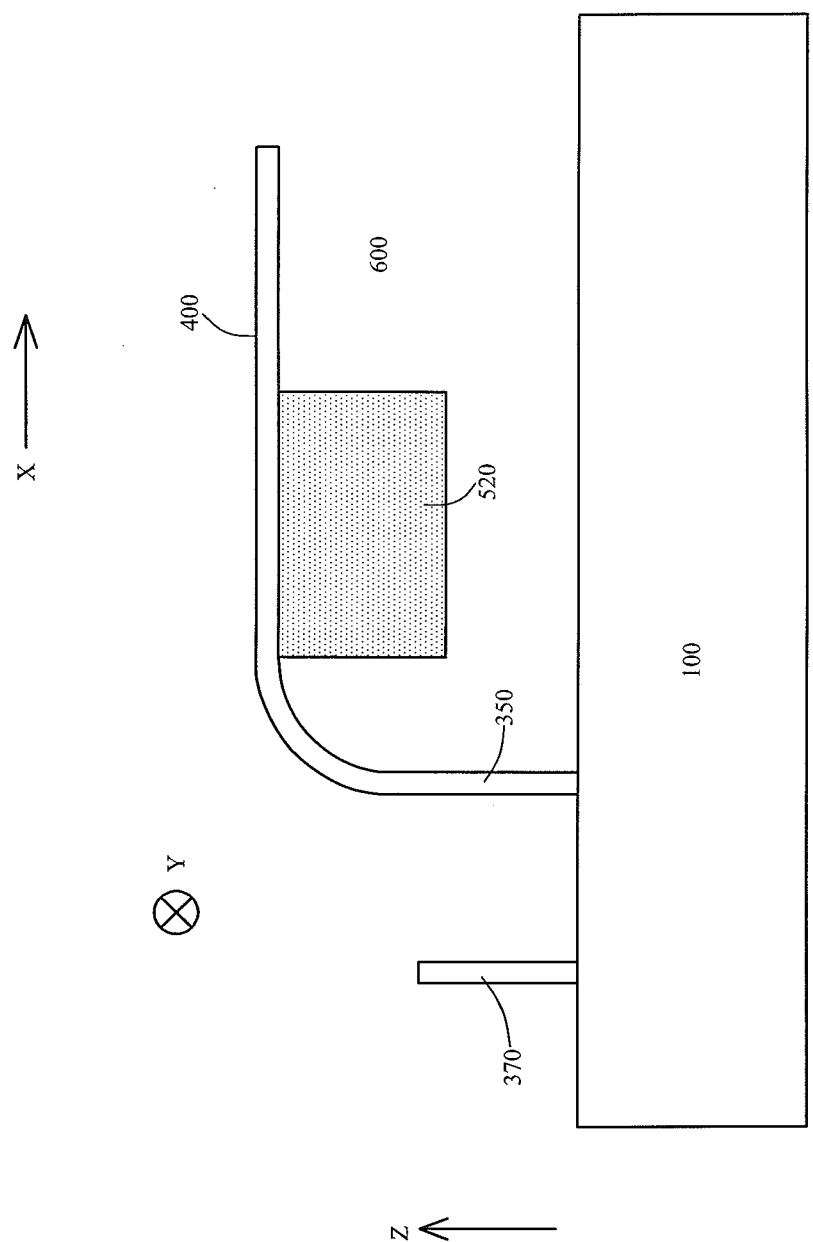
FIG. 5 shows the schematic cross section view taken along line C-C' of FIG. 3.

Since the cross section view taken along line D-D' of FIG. 3 is the same one shown in FIG. 4 and FIG. 4 is fully explained in the previous paragraph, repetitions will be omitted here. The cross section view taken along line C-C' of FIG. 3 is shown in FIG. 5. Compared with FIG. 4, in FIG. 5 the downward trench is at the second side of the horizontal magnetoresistive layer 400, so the magnetic-field-sensing layer 350 and opposite magnetoresistive layer 370 are at the second of the horizontal magnetoresistive layer 400. All the modified embodiments addressed with respect to FIG. 4 can be equally applied to FIG. 5, their example or descriptions are omitted here to save repetitions.

Figure 6:
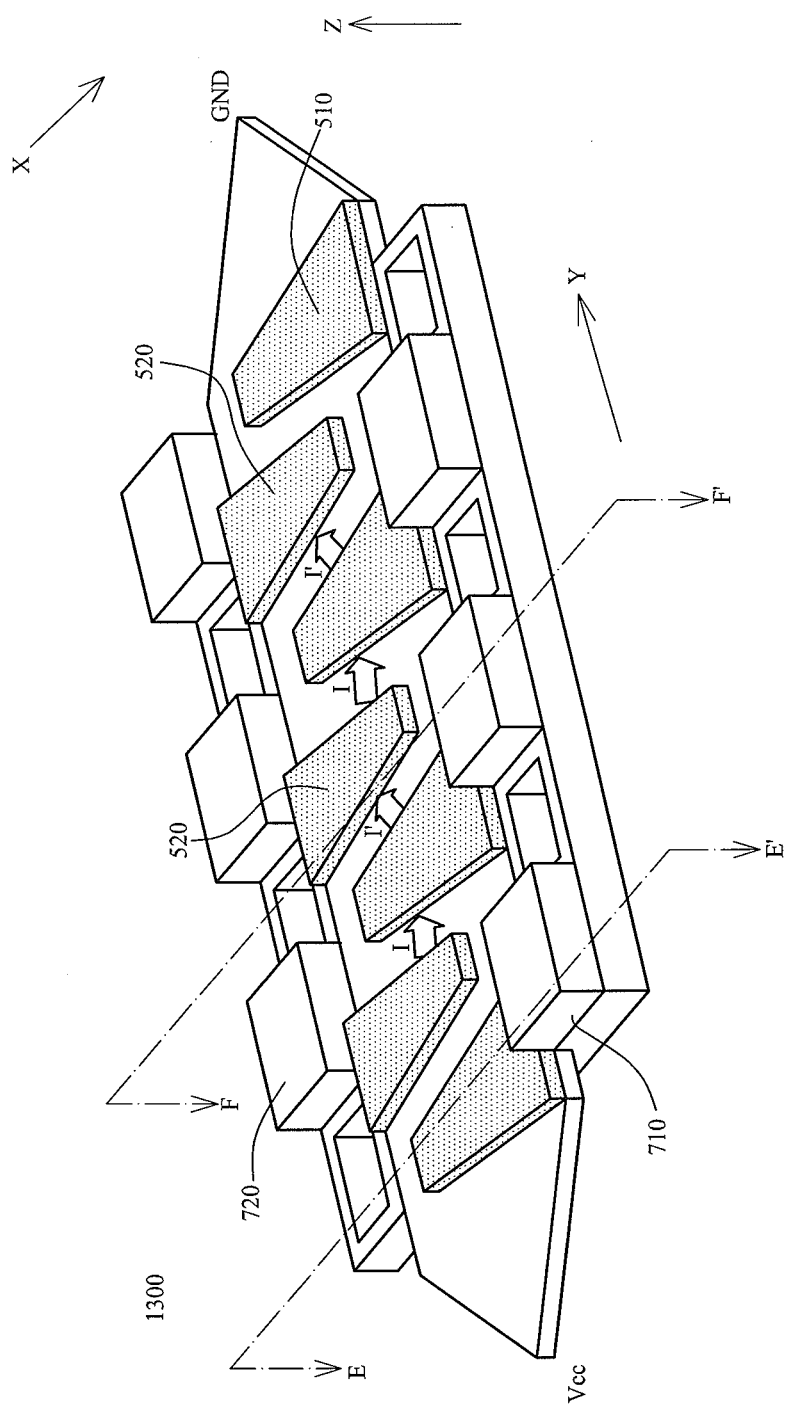
FIG. 6 shows the schematic three-dimensional view of the Z-axis magnetoresistive sensing component according to still another embodiment of the present invention.
Figure 7A:
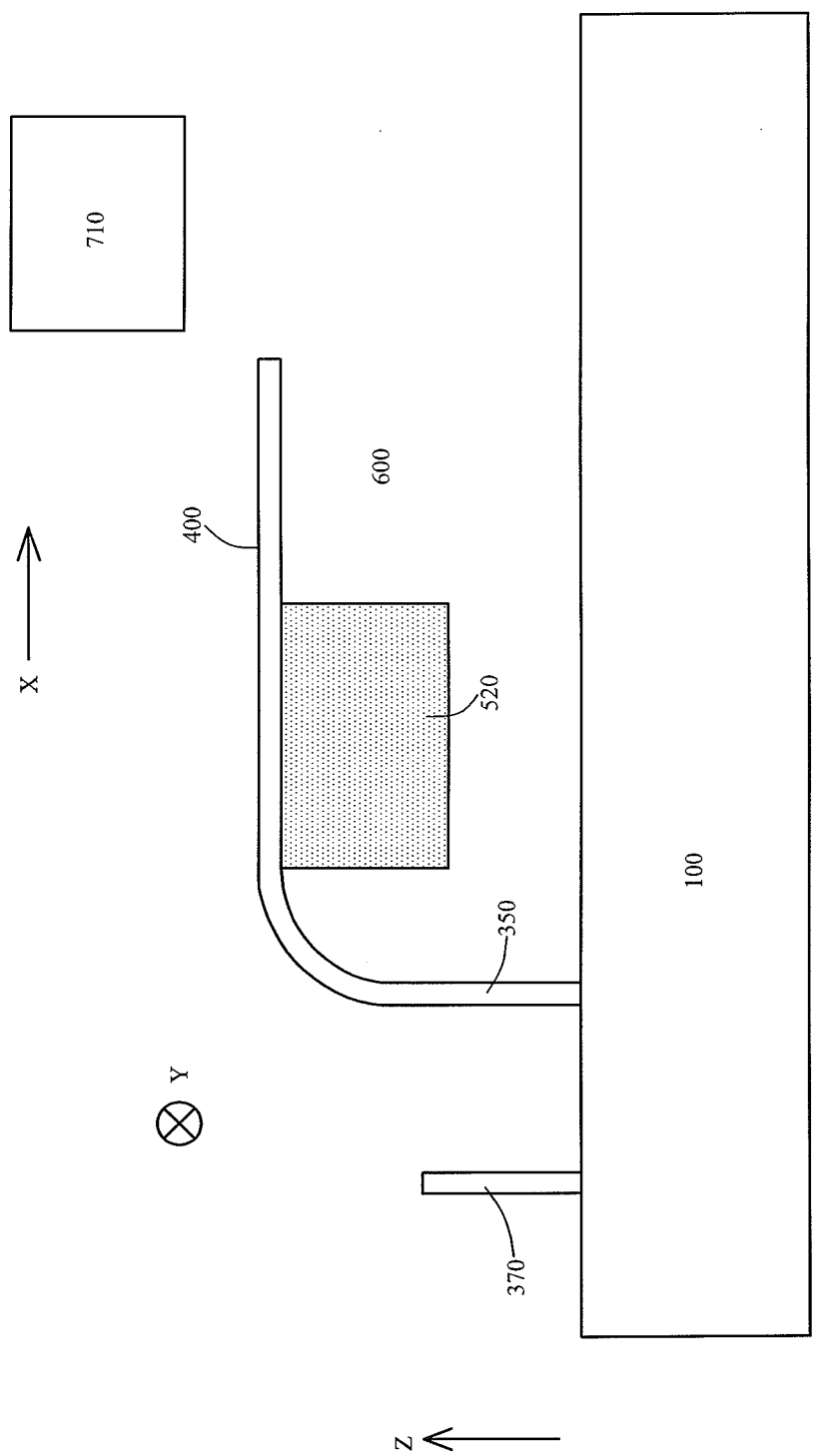
FIG. 7A shows the schematic cross section view taken along line E-E' of FIG. 6.
Figure 7B:
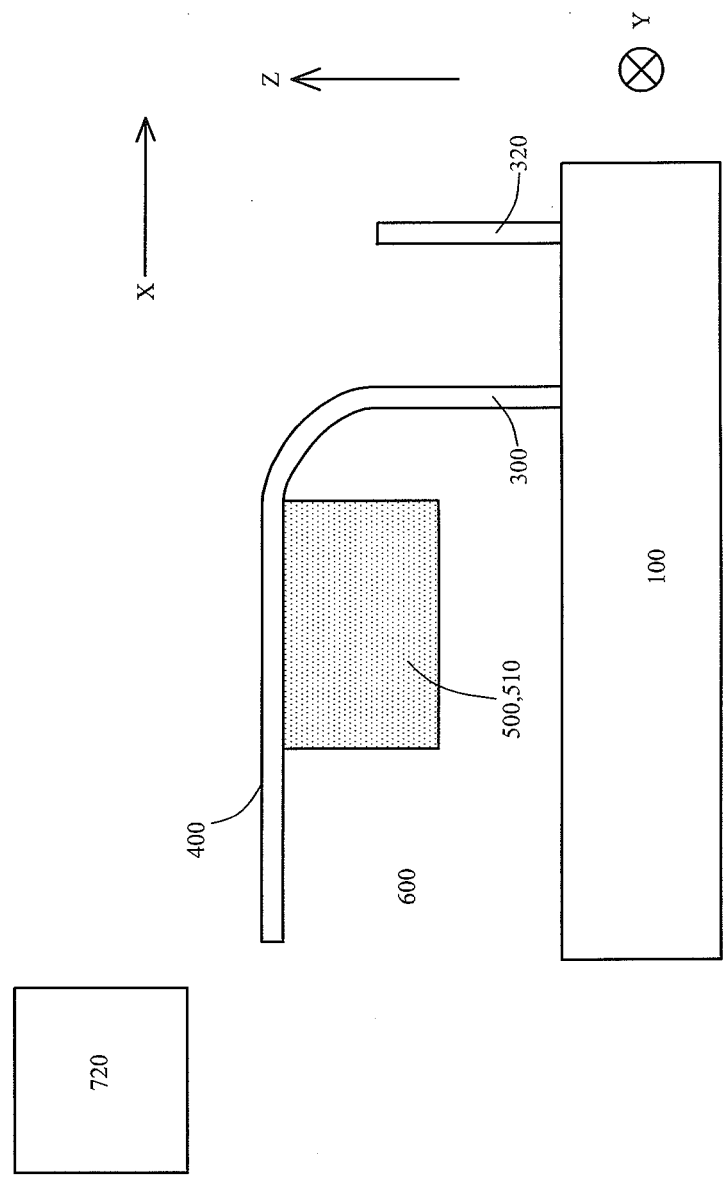
FIG. 7B shows the schematic cross section view taken along line F-F' of FIG. 6.
Figure 8A:
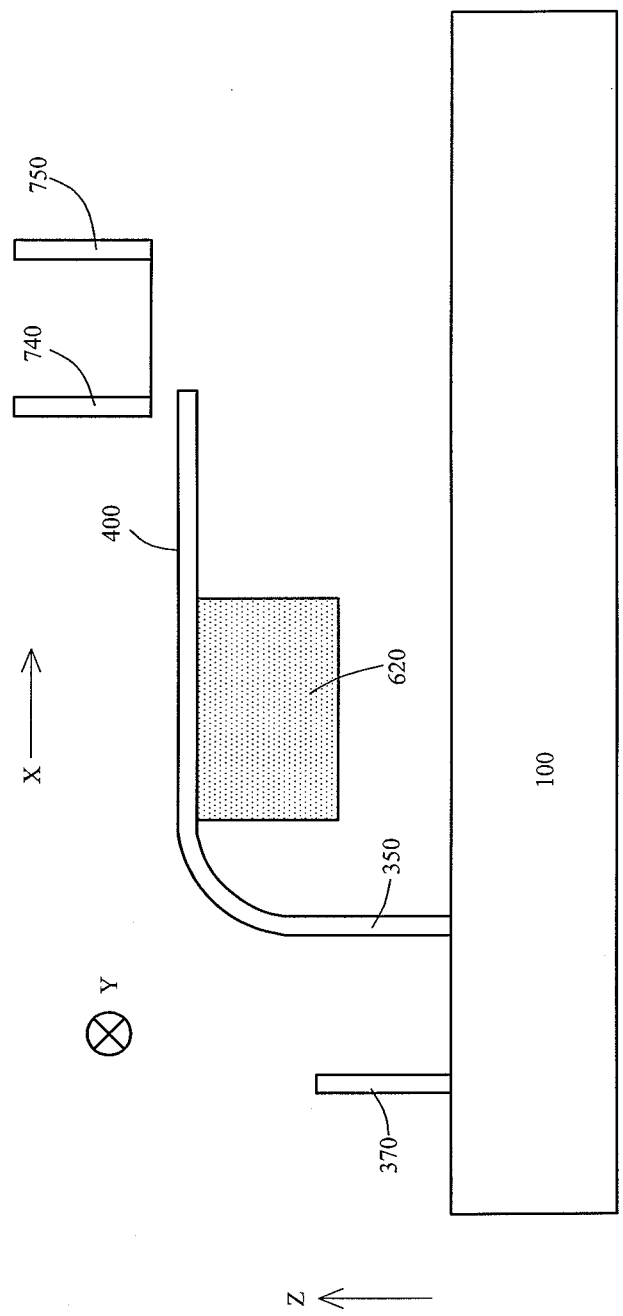
FIG. 8A shows another embodiment of the cross section shown in FIG. 7A.
Figure 8B:
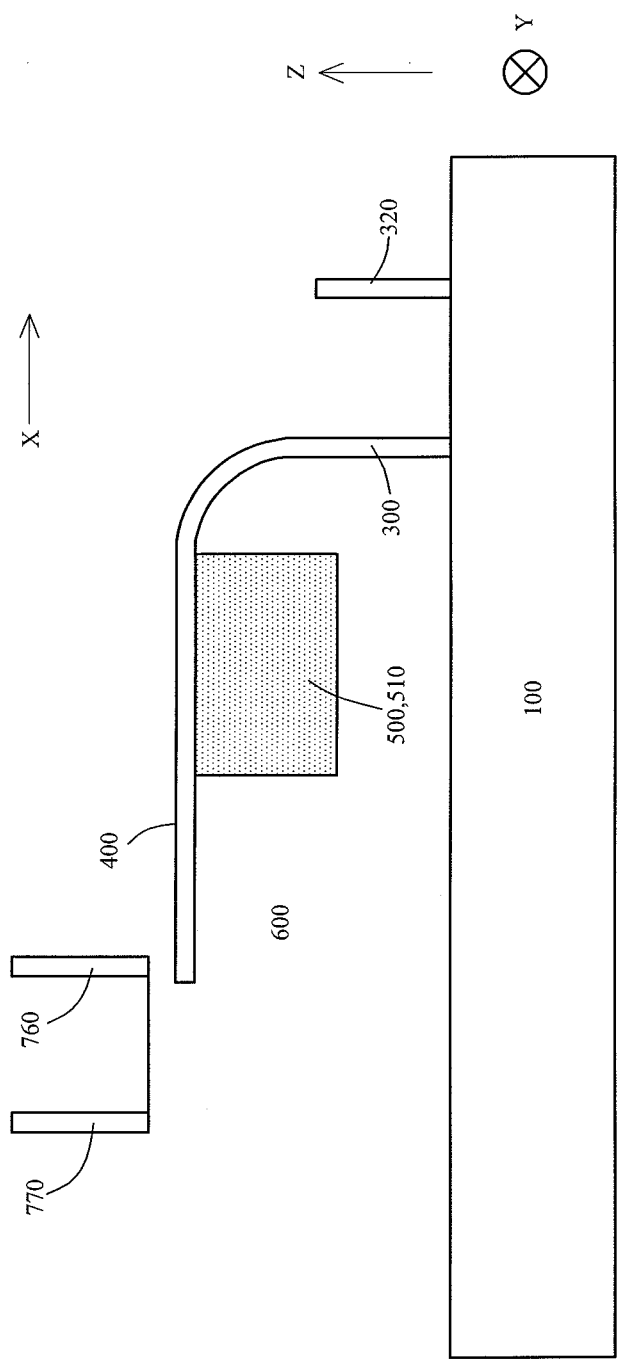
FIG. 8B shows another embodiment of the cross section shown in FIG. 7B.

Now refer to FIG. 6, FIG. 7A and FIG. 7B. They show the schematic three-dimensional view, cross section view taken along line E-E' of FIG. 6 and cross section view taken along line F-F' of FIG. 6 of the Z-axis magnetoresistive sensing component 1300 according to still another embodiment of the present invention. Z-axis magnetoresistive sensing component 1300 share the same operational principle with the Z-axis magnetoresistive sensing component 1200 of FIG. 3. The shapes, materials, orientations, relative positions of the horizontal magnetoresistive layer 400, conductive part 510, conductive part 520, magnetic-field-sensing layer 300 and magnetic-field-sensing layer 350 and conducting path and direction of the electrical current are the same for Z-axis magnetoresistive sensing component 1200 and 1300, so here only the differences are addressed. In this embodiment, Z-axis magnetoresistive sensing component 1300 comprises all the elements of Z-axis magnetoresistive sensing component 1200 and further comprises multiple first magnetic flux concentrating structures 710 and multiple second magnetic flux concentrating structures 720. Multiple first magnetic flux concentrating structures 710 extend upwards from the first side of the horizontal magnetoresistive layer 400 and magnetically coupled thereto. Multiple first magnetic flux concentrating structures 710 and the sub-portions of the magnetic-field-sensing layer 300 are disposed alternatively along the first side of the horizontal magnetoresistive layer. Multiple second magnetic flux concentrating structures 720 extend upwards from the second side of the horizontal magnetoresistive layer 400 and magnetically coupled thereto. Multiple second magnetic flux concentrating structures 720 and the sub-portions of the magnetic-field-sensing layer 350 are disposed alternatively along the second side of the horizontal magnetoresistive layer. From FIGS. 6, 7A and 7B we can see the first magnetic flux concentrating structures 710 and second magnetic flux concentrating structures 720 take a form of a cubic of the same size and they preferably be disposed above the first or second sides of the horizontal magnetoresistive layer 400 (not right above the horizontal magnetoresistive layer 400). In this way, they can effectively concentrate/guide the magnetic flux passing through the horizontal magnetoresistive layer 400. However, they can adopt other forms or different shape of bulk structure according to design and/or process requirements as long as they use magnetic materials or magnetoresistive materials. For example, as shown in FIG. 8A and FIG. 8B, use one/more upward trenches above the first side and portions 740/750 of magnetoresistive layers on the sidewalls of the upward trenches to replace the first magnetic flux concentrating structures 710 and use one/more upward trenches above the second side and portions 760/770 of magnetoresistive layers on the sidewalls of the upward trenches to replace second magnetic flux concentrating structures 720. It is noted that portions of the magnetoresistive material on the sidewall parallel to the paper surface are not shown. 740 is the magnetic-field-guiding layer of the first side and 760 is the magnetic-field-guiding layer of the second side. Both of 740 and 760 are not parallel to the substrate surface and have functions of guiding magnetic flux and sensing magnetic field. Therefore, when 740/750 of magnetic/magnetoresistive material and 760/770 of magnetic/magnetoresistive material are used to sense magnetic field, they are referred to as the third magnetic-field-sensing layer to be distinguished from the magnetic-field-sensing layer 300 of the first side and the magnetic-field-sensing layer 350 of the second side. Other elements shown in FIGS. 7A, 7B, 8A and 8B have already been explained in relation to FIG. 4 and FIG. 5, they are not described again.

Furthermore, the magnetic flux concentrating structures shown in FIGS. 7A, 7B, 8A and 8B (that is one of 710, 720, 740+750 and 760+770 or any combination thereof) can be equally applied to the first side or second side or both sides of all the Z-axis magnetoresistive sensing components 1000, 1000', 1200, 1300, 1400, 1500, 1600. For example for Z-axis magnetoresistive sensing component 1000, a second magnetic flux concentrating structure 720 of long strip shape shown in FIG. 7B can be disposed above the second side of the horizontal magnetoresistive layer 400 or a long trench and the magnetoresistive layer on the sidewall of the trench shown in FIG. 8B can be disposed above the second side of the horizontal magnetoresistive layer 400. For example for Z-axis magnetoresistive sensing component 1100, second magnetic flux concentrating structures 720 of cubic shape shown in FIG. 7B can be disposed above the second side of the horizontal magnetoresistive layer 400 or a long trench and the magnetoresistive layer on the sidewall of the trench shown in FIG. 8B can be disposed above the second side of the horizontal magnetoresistive layer 400.

Figure 9A:
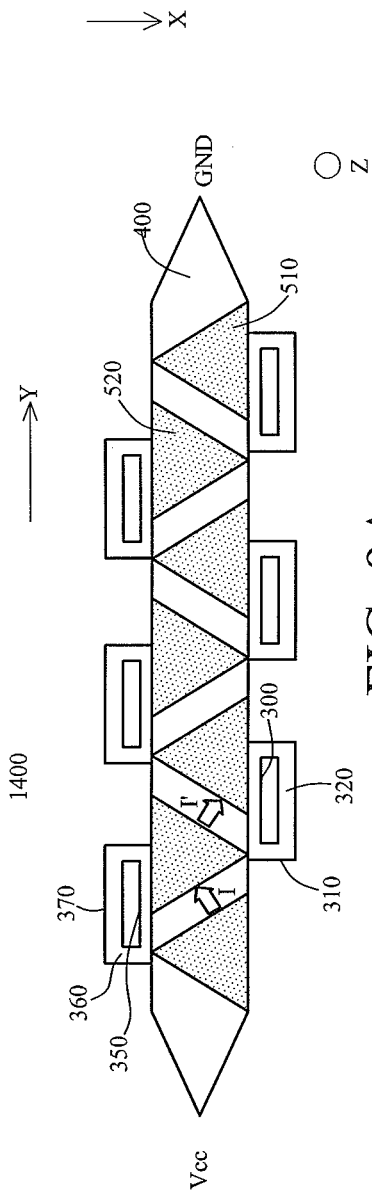
FIGS. 9A-9C show the top views of the Z-axis magnetoresistive sensing components according to other embodiments of the present invention.
Figure 9B:
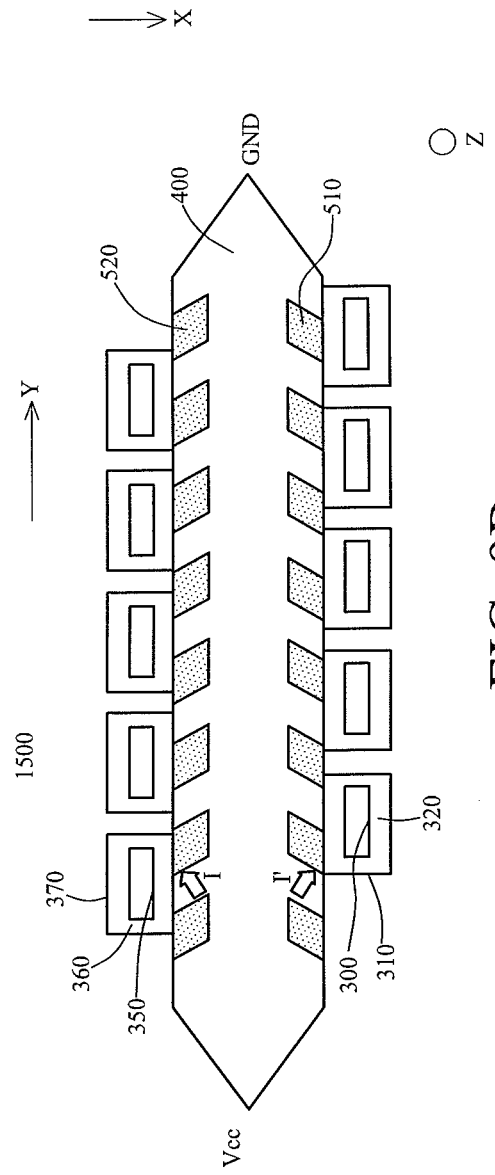
Figure 9C:
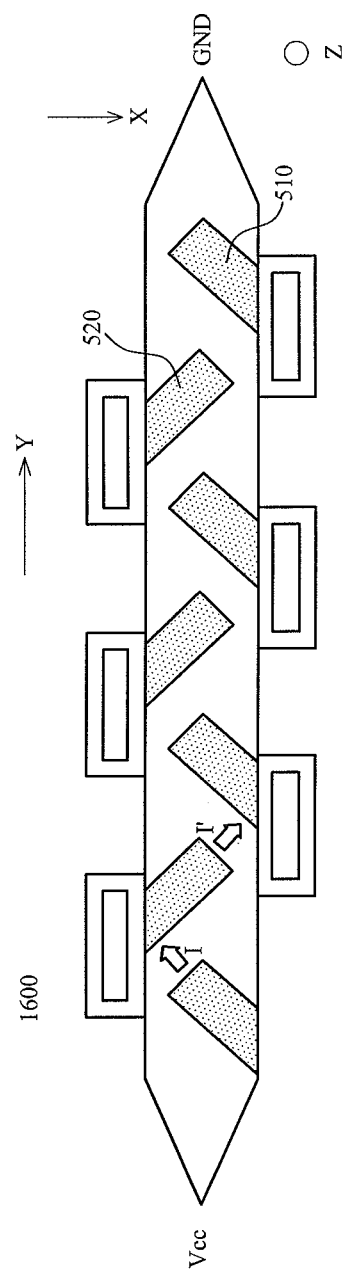

Now refer to FIGS. 9A-9C, they show the top views of the Z-axis magnetoresistive sensing components according to other embodiments of the present invention. After detailed explanations for Z-axis magnetoresistive sensing component 1200 of FIG. 3 are provided, a person of ordinary skills in the art should understand that the explanations for FIG. 3 can be foundations to embodiments of FIG. 9A-9C, so repetitions are omitted here. The difference between Z-axis magnetoresistive sensing component 1400 of FIGS. 9A and Z-axis magnetoresistive sensing component 1200 is: the conductive part 510 of the first side and the conductive part 520 of the second side of FIG. 3 are trapezoid-shaped and they all extend from one side of the horizontal magnetoresistive layer 400 toward the other side of the horizontal magnetoresistive layer 400 without reaching the other side while the conductive part 510 of the first side and the conductive part 520 of the second side of FIG. 9A take isosceles triangle or equilateral triangle as their shape (depends on width of the horizontal magnetoresistive layer 400) and they all extend from one side of the horizontal magnetoresistive layer 400 toward the other side of the horizontal magnetoresistive layer 400 reaching the other side. Since the arrangement of the horizontal magnetoresistive layer 400, the magnetic-field-sensing layer 300 of the first side and the magnetic-field-sensing layer 350 of the second side are the same as the one of FIG. 3, they are not repeated again.

There are several differences between the Z-axis magnetoresistive sensing component 1500 of FIGS. 9B and Z-axis magnetoresistive sensing component 1200. First, the multiple downward trenches of the first side and the multiple downward trenches of the second side of FIG. 3 are spread out more than the ones of FIG. 9B, thereby distance between the adjacent sub-portions of the magnetic-field-sensing layer 300 and distance between the adjacent sub-portions of the magnetic-field-sensing layer 350 of FIG. 3 are farer than the ones of FIG. 9B. So the magnetic-field-sensing layer 300 and magnetic-field-sensing layer 350 of FIG. 9B are disposed alternatively along the extending direction of the horizontal magnetoresistive layer 400 but they overlap more than the ones of FIG. 3. Second, the conductive part 510 of the first side and the conductive part 520 of the second side of FIG. 3 are trapezoid-shaped, they all extend from one side of the horizontal magnetoresistive layer 400 toward the other side of the horizontal magnetoresistive layer 400 passing the half width of the horizontal magnetoresistive layer 400 and they are disposed alternatively along the extending direction of the horizontal magnetoresistive layer 400. the conductive part 510 of the first side and the conductive part 520 of the second side of FIG. 9B are parallelogram-shaped, they all extend from one side of the horizontal magnetoresistive layer 400 toward the other side of the horizontal magnetoresistive layer 400 without passing the half width of the horizontal magnetoresistive layer 400 and they are disposed symmetrically along the extending direction of the horizontal magnetoresistive layer 400.

Since the differences addressed in the previous paragraph, when Z-axis magnetoresistive sensing component 1500 operates, the electrical current does not flow from the conductive part 510 of the first side to the conductive part 520 of the second side or from the conductive part 520 of the second side to the conductive part 510 of the first side. Because the conductive part 510 of the first side and the conductive part 520 of the second side have farer distance between them and the high resistivity of the magnetoresistive material between them, the conducting path become the following route: in an area where the conductive part 510 is in physically contact with the horizontal magnetoresistive layer 400 electrical current would take the conductive part 510 with smaller resistivity as its conducting path while within the horizontal magnetoresistive layer 400 (that is, between the adjacent conductive parts 510) electrical current I' would take the shortest distance between the adjacent conductive parts 510 as its conducting path. The horizontal magnetoresistive layer 400 and the conductive parts 510 together form at least one electrical path (horizontal magnetoresistive layer 400→conductive part 510→horizontal magnetoresistive layer 400 between the adjacent conductive parts 510→the next conductive part 510 . . . ). Similarly, within the horizontal magnetoresistive layer 400 (that is, between the adjacent conductive parts 520) electrical current I would take the shortest distance between the adjacent conductive parts 520 as its conducting path. The horizontal magnetoresistive layer 400 and the conductive parts 520 together form at least one electrical path (horizontal magnetoresistive layer 400→conductive part 520→horizontal magnetoresistive layer 400 between the adjacent conductive parts 520→the next conductive part 520 . . . ). When the conductive part 510 and the conductive part 520 have the same shape, size and distance between the adjacent ones, an angle between a first conducting direction of current I' and the extending direction of the horizontal magnetoresistive layer 400 is equivalent to an angle between a second conducting direction of current I and the extending direction of the horizontal magnetoresistive layer 400. The value of the angle depends on the slope of the parallel sides of the Parallelogram.

There are several differences between the Z-axis magnetoresistive sensing component 1600 of FIGS. 9C and Z-axis magnetoresistive sensing component 1200. The conductive part 510 of the first side and the conductive part 520 of the second side of FIG. 3 are trapezoid-shaped, electrical current of FIG. 3 flows from a leg of the conductive part of one side to a leg of the adjacent conductive part of the other side, and each conductive part 510/520 partially overlap with the corresponding magnetic-field-sensing layer 300/350. In FIG. 9C, the conductive part 510 of the first side and the conductive part 520 of the second side have a long strip shape not parallel to the horizontal magnetoresistive layer 400, electrical current flows from the pointing end of a conductive part of one side to the base end of the next conductive part of the other side, and each conductive part 510/520 completely overlap with the corresponding magnetic-field-sensing layer 300/350. When the conductive part 510 and the conductive part 520 have the same shape, size, distance between the adjacent ones and value of tilted angle with respect to the extending direction of the horizontal magnetoresistive layer 400, an angle between a first conducting direction of current I' and the extending direction of the horizontal magnetoresistive layer 400 is equivalent to an angle between a second conducting direction of current I and the extending direction of the horizontal magnetoresistive layer 400. The value of the angle depends on the value of tilted angle with respect to the extending direction of the horizontal magnetoresistive layer 400.

In the previous embodiments, since in Z-axis magnetoresistive sensing components 1000 and 1100 the electrical currents i flowing between the adjacent conductive parts 500 follow an unique direction, the outputs of Z-axis magnetoresistive sensing components 1000 and 1100 not only respond to an Z-axis magnetic field but also respond to an X-axis magnetic field. Therefore, a measure of designing a combination of Z-axis magnetoresistive sensing components 1000/1100 of different orientations or a measure of adding extra circuitry must be taken for the Z-axis magnetoresistive sensing device in order to render the Z-axis magnetoresistive sensing device responsive to a Z-axis magnetic field but immune to a X-axis magnetic field.

In the Z-axis magnetoresistive sensing component 1200, 1300, 1400, 1500, 1600, electrical current between the adjacent conductive parts (that is conductive part of the first side and the adjacent conductive part of the second except for 1500; for 1500, conductive part of the first side and the adjacent conductive part of the first side or conductive part of the second side and the adjacent conductive part of the second side) have two conducting directions (I and I') and said two directions are symmetrical to the extending direction of the horizontal magnetoresistive layer 400. Therefore, when an external magnetic field of X-direction is applied upon these Z-axis magnetoresistive sensing components (that is, magnetic flux points from one side of the horizontal magnetoresistive layer 400 to the other side), the effects caused by two conducting directions would counteract, thereby resulting in almost no change on the output of these Z-axis magnetoresistive sensing components. When an external magnetic field of Z-direction is applied upon these Z-axis magnetoresistive sensing components (that is two kinds of magnetic fluxes, one kind of magnetic flux points from first side of the horizontal magnetoresistive layer 400 to the second side and the other kind of magnetic flux points from the second side to the first side), the two conducting directions interact with the two kinds of magnetic fluxes, thereby resulting in a change on the output of these Z-axis magnetoresistive sensing components. Therefore Z-axis magnetoresistive sensing component 1200, 1300, 1400, 1500, 1600 can be used alone to achieve the result of sensing Z-axis magnetic field.

Figures 10A, 10B:
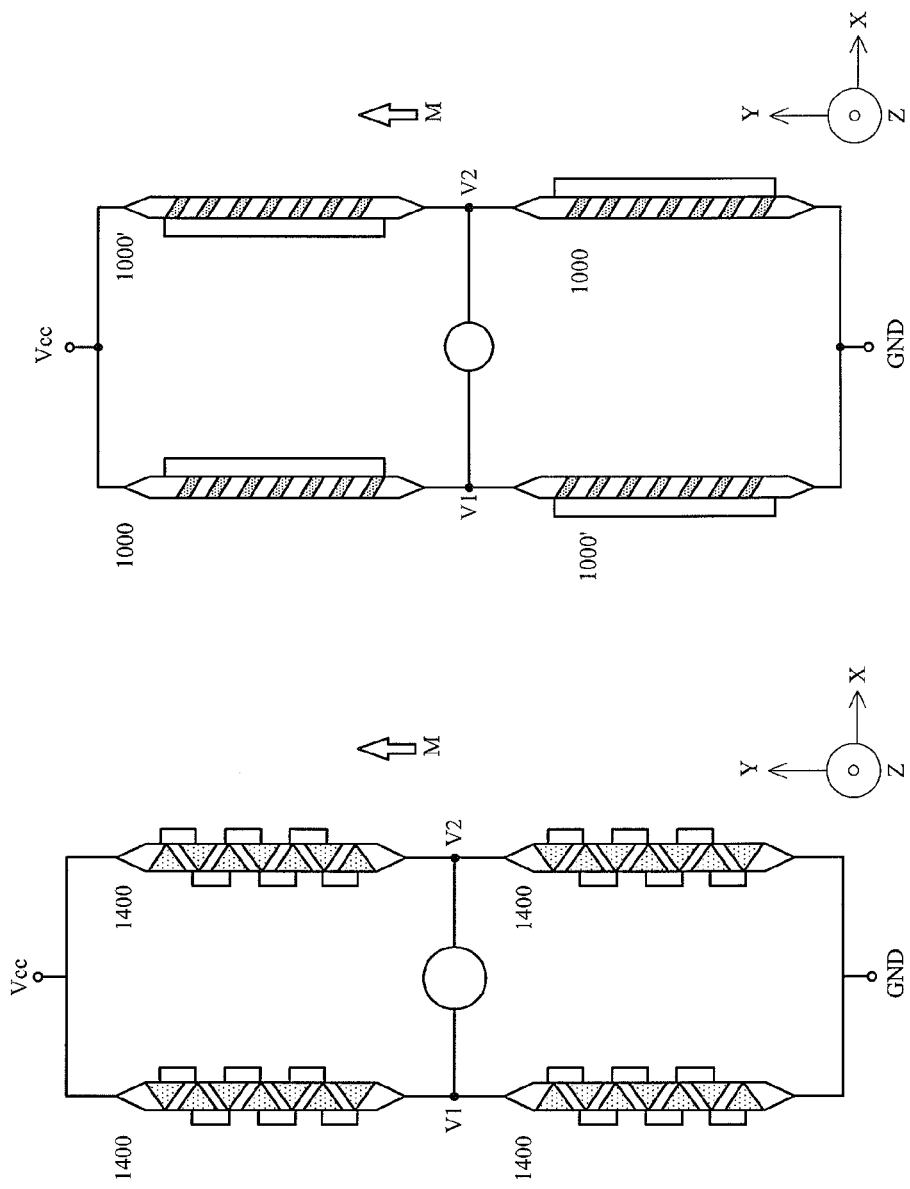
FIGS. 10A-10B show the Z-axis magnetoresistive sensing devices according to embodiments of the present invention, wherein the Z-axis magnetoresistive sensing devices comprise a Wheatstone bridge structure comprising the Z-axis magnetoresistive sensing components according to embodiments of the present invention.

Now refer to FIGS. 10A-10B, they show the Z-axis magnetoresistive sensing devices according to embodiments of the present invention, wherein the Z-axis magnetoresistive sensing devices comprise a Wheatstone bridge structure comprising the Z-axis magnetoresistive sensing components according to embodiments of the present invention.

The Z-axis magnetoresistive sensing device of FIG. 10A comprises a Wheatstone bridge structure. This Wheatstone bridge structure has 4 resistive arms (upper right arm, lower right arm, upper left arm and lower left arm) and each resistive arm at least comprises a Z-axis magnetoresistive sensing component 1400. Although in this fig. each resistive arm only comprises a Z-axis magnetoresistive sensing component 1400, each resistive arm may comprise multiple Z-axis magnetoresistive sensing components 1400 connected by interconnect in serial electrical connection. Furthermore, Z-axis magnetoresistive sensing component 1400 in each resistive arm may be replaced by any one of Z-axis magnetoresistive sensing component 1200, 1300, 1500, 1600 or their modified embodiment while keeping the operation of the whole Wheatstone bridge structure. The upper end of the upper right resistive arm is electrically coupled to working voltage Vcc by interconnect; the lower end of the upper right resistive arm is electrically coupled to the upper end of the lower right resistive arm by interconnect and the voltage between these two arms is defined as second voltage V2. The lower end of the lower right resistive arm is electrically coupled to ground by interconnect. The upper end of the upper left resistive arm is electrically coupled to working voltage Vcc by interconnect; the lower end of the upper left resistive arm is electrically coupled to the upper end of the lower left resistive arm by interconnect and the voltage between these two arms is defined as first voltage V1. The lower end of the lower left resistive arm is electrically coupled to ground by interconnect. One may optionally adjust the magnetization direction of the horizontal magnetoresistive layer 400 within the 4 resistive arms into a predetermined direction (represented by direction of M, that is Y-direction in this embodiment) by a set/reset circuitry before using the Wheatstone bridge structure. When the magnetic-field-sensing layers 300/350 feel a Z-axis magnetic field, a change of the resistance may occur to resistive arms of the bridge structure in response to a change of the external magnetic field. This may cause a change of the voltage difference between first voltage V1 and second voltage V2.

The Z-axis magnetoresistive sensing device of FIG. 10B also comprises a Wheatstone bridge structure. The Z-axis magnetoresistive sensing device of FIG. 10A uses 4 identical Z-axis magnetoresistive sensing components, while The Z-axis magnetoresistive sensing device of FIG. 10B uses a pair of Z-axis magnetoresistive sensing components 1000 and a pair of Z-axis magnetoresistive sensing components 1000' to counteract an influence caused by X-axis magnetic field. The difference between the Z-axis magnetoresistive sensing component 1000 and 1000' is that the magnetic-field-sensing layer 300 of component 1000 is at the first side of the horizontal magnetoresistive layer 400 while the magnetic-field-sensing layer 300 of component 1000' is at the second side of the horizontal magnetoresistive layer 400. However, to keep the operation of the bridge structure, in FIG. 10B the orientations of the magnetic-field-sensing layer 300 can be properly adjusted (at the first side or second side) or the orientations of the conductive parts can be properly adjusted (left up right down or left down right up). Since the bridge structure of FIG. 10B is similar to the bridge structure of FIG. 10A in their basic structure, arm connections and operations, the descriptions thereof is omitted here to save repetitions.

The following table 1 and table 2 in their content show the status of the upper left arm, the lower left arm, the upper right arm and the lower right arm of the bridge structures when applying an external magnetic field of +X-direction and +Z-direction respectively to the bridge structures of 10A and 10B. The +X-direction is defined as a direction pointing from the second side of the horizontal magnetoresistive layer 400 to its first side and the –X-direction is defined as a direction pointing from the first side of the horizontal magnetoresistive layer 400 to its second side. Similarly, the +Z-direction is defined as a direction pointing from the substrate surface to the horizontal magnetoresistive layer 400 and the −Z-direction is defined as a direction pointing from the horizontal magnetoresistive layer 400 to the substrate surface.

TABLE 1

The responses and outputs of all the resistive arms of the bridge structures in FIG. 10A and 10B when applying an external magnetic field of the +X-direction

|  | Upper left arm | Lower left arm | Upper right arm | Lower right arm |
|---|---|---|---|---|
| Bridge structure of 10A |  |  |  |  |
| Magnetic field felt | +X-direction | +X-direction | +X-direction | +X-direction |
| Change of resistance | ~0 | ~0 | ~0 | ~0 |
| Output voltage |  | ΔV = V1-V2 = ~0 |  |  |
| Bridge structure of 10B |  |  |  |  |
| Magnetic field felt | +X-direction | +X-direction | +X-direction | +X-direction |
| Change of resistance | increased | increased | increased | increased |
| Output voltage |  | ΔV = V1-V2 = ~0 |  |  |

TABLE 2

The responses and outputs of all the resistive arms of the bridge structures in FIG. 10A and 10B when applying an external magnetic field of the direction of +Z

|  | Upper left arm | Lower left arm | Upper right arm | Lower right arm |
|---|---|---|---|---|
| Bridge structure of 10A |  |  |  |  |
| Magnetic field felt | +X-direction and −X-direction | +X-direction and −X-direction | +X-direction and −X-direction | +X-direction and −X-direction |
| Change of resistance | decreased | increased | increased | decreased |
| Output voltage |  | ΔV = V1-V2≠0 |  |  |
| Bridge structure of 10B |  |  |  |  |
| Magnetic field felt | −X-direction | +X-direction | +X-direction | −X-direction |
| Change of resistance | decreased | increased | increased | decreased |
| Output voltage |  | ΔV = V1-V2≠0 |  |  |

Although the exact output voltages are not shown in table 1 and table 2, it is noted that the output voltage of the bridge structure 10A is larger than the output voltage of the bridge structure 10B when same amount of external magnetic field of +Z-direction is applied to both structures 10A and 10B. That is, the bridge structure of 10A is more sensitive than the bridge structure of 10B.

FIGS. 10A and 10B show the magnetoresistive sensing devices according to embodiments of the present invention. However, the so-called magnetoresistive sensing device is a device capable of sensing a change of magnetic field of a specific direction and not necessarily taking a form of Wheatstone bridge structure. Furthermore, the present invention comprises a magnetic-field-sensing layer not parallel to the surface of the substrate and this magnetic-field-sensing layer is not limited to a shape of thin plate as long as it is capable of sensing Z-axis magnetic field that is perpendicular to the surface of the substrate. It may be a vertical portion of any three dimensional structure such as a portion of a magnetoresistive layer on the sidewall of a cylindrical or a rectangular trench. If it is integrated with a magnetoresistive sensing component capable of sensing X-axis/Y-axis magnetic field that is parallel to the surface of the substrate, package complexity and size of the final sensing product can be significantly reduced.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A magnetoresistive sensing component comprising
a strip of horizontal magnetoresistive layer, disposed above a surface of a substrate, having a first side and a second side opposite the first side, along its extending direction;
a conductive part disposed above or below the horizontal magnetoresistive layer and electrically coupled thereto, the conductive part and the horizontal magnetoresistive layer together form at least an electrical current path, the direction of the electrical current path in the horizontal magnetoresistive layer not parallel to the extending direction of the horizontal magnetoresistive layer; and
a first magnetic-field-sensing layer not parallel to the surface of the substrate and magnetically coupled to the horizontal magnetoresistive layer at the first side of the horizontal magnetoresistive layer.

2. The magnetoresistive sensing component according to claim 1, wherein the horizontal magnetoresistive layer and the first magnetic-field-sensing layer comprise an anisotropic Magnetoresistive (AMR) material.

3. The magnetoresistive sensing component according to claim 1, wherein the resistance of the horizontal magnetoresistive layer and the first magnetic-field-sensing layer would change according to a change of an external magnetic field and the horizontal magnetoresistive layer and the first magnetic-field-sensing layer comprise one of a ferromagnet material, an antiferromagnet material, nonferromagnet material and tunneling oxide or any combination thereof.

4. The magnetoresistive sensing component according to claim 1, wherein the conductive part comprises multiple conductive strips, an extending direction of these multiple conductive strips forms an acute angle with respect to the extending direction of the horizontal magnetoresistive layer, and the distance between the adjacent conductive strips are the same.

5. The magnetoresistive sensing component according to claim 1, wherein the first magnetic-field-sensing layer extends upwards or downwards from the first side of the horizontal magnetoresistive layer.

6. The magnetoresistive sensing component according to claim 1, wherein the first magnetic-field-sensing layer is a long strip or comprises multiple discrete sub-portions.

7. The magnetoresistive sensing component according to claim 1, wherein the conductive part comprises multiple conductive portions of the first side extending from the first side towards the second side and multiple conductive portions of the second side extending from the second side towards the first side.

8. The magnetoresistive sensing component according to claim 7, further comprising
a second magnetic-field-sensing layer not parallel to the surface of the substrate and magnetically coupled to the horizontal magnetoresistive layer at the second side of the horizontal magnetoresistive layer,
wherein the first magnetic-field-sensing layer comprises multiple discrete sub-portions and all the sub-portions of the first magnetic-field-sensing layer extend upwards or downwards from the first side of the horizontal magnetoresistive layer, the second magnetic-field-sensing layer comprises multiple discrete sub-portions and all the sub-portions of the second magnetic-field-sensing layer extend upwards or downwards from the second side of the horizontal magnetoresistive layer.

9. The magnetoresistive sensing component according to claim 8, further comprising:
the sub-portions of the first magnetic-field-sensing layer and the sub-portions of the second magnetic-field-sensing layer are disposed alternatively along the extending direction of the horizontal magnetoresistive layer.

10. The magnetoresistive sensing component according to claim 8, wherein the sub-portions of the first magnetic-field-sensing layer at least partially overlap with the corresponding multiple conductive portions of the first side, and the sub-portions of the second magnetic-field-sensing layer at least partially overlap with the corresponding multiple conductive portions of the second side.

11. The magnetoresistive sensing component according to claim 8, wherein the multiple conductive portions of the first side and multiple conductive portions of the second side are disposed alternatively or symmetrically along the extending direction of the horizontal magnetoresistive layer.

12. The magnetoresistive sensing component according to claim 7, wherein within the horizontal magnetoresistive layer an electrical current flows from one of the conductive portions of the first side to the adjacent one of the conductive portions of the second side along a first conducting direction and an electrical current flows from one of the conductive portions of the second side to the adjacent one of the conductive portions of the first side along a second conducting direction, the first conducting direction is not parallel to the second conducting direction.

13. The magnetoresistive sensing component according to claim 12, wherein an acute angle between the first conducting direction and the extending direction of the horizontal magnetoresistive layer is equivalent to an acute angle between the second conducting direction and the extending direction of the horizontal magnetoresistive layer.

14. The magnetoresistive sensing component according to claim 7, wherein within the horizontal magnetoresistive layer an electrical current flows from one of the conductive portions of the first side to the adjacent one of the conductive portions of the first side along a first conducting direction and an electrical current flows from one of the conductive portions of the second side to the adjacent one of the conductive portions of the second side along a second conducting direction, the first conducting direction is not parallel to the second conducting direction.

15. The magnetoresistive sensing component according to claim 14, wherein an acute angle between the first conducting direction and the extending direction of the horizontal magnetoresistive layer is equivalent to an acute angle between the second conducting direction and the extending direction of the horizontal magnetoresistive layer.

16. The magnetoresistive sensing component according to claim 1, further comprising:
a second magnetic-field-sensing layer extending upwards or downwards from the second side of the horizontal magnetoresistive layer and magnetically coupled thereto.

17. The magnetoresistive sensing component according to claim 1, further comprising:
a third magnetic-field-sensing layer not parallel to the surface of the substrate, disposed above the horizontal magnetoresistive layer and magnetically coupled thereto.

18. The magnetoresistive sensing component according to claim 1, further comprising:
at least a first magnetic flux concentrating structure.

19. The magnetoresistive sensing component according to claim 18, wherein the first magnetic flux concentrating structure takes a form of a portion of a magnetoresistive layer on a sidewall of a trench or a form of a bulk magnetoresistive material.

20. The magnetoresistive sensing component according to claim 1, further comprising:
multiple first magnetic flux concentrating structures extending upwards from the first side of the horizontal magnetoresistive layer and magnetically coupled thereto,
wherein the first magnetic-field-sensing layer comprises multiple sub-portions and the first magnetic flux concentrating structures and the sub-portions of the first magnetic-field-sensing layer are disposed alternatively along the first side of the horizontal magnetoresistive layer.

21. A magnetoresistive sensing device, comprising:
a Wheatstone bridge structure comprising four resistive arms and each resistive arm comprising the magnetoresistive sensing component according to claim 1.

22. The magnetoresistive sensing device according to claim 21, wherein the conductive part of the magnetoresistive sensing component comprises multiple conductive portions of the first side extending from the first side towards the second side and multiple conductive portions of the second side extending from the second side towards the first side.

23. The magnetoresistive sensing device according to claim 22, further comprising:
the first magnetic-field-sensing layer comprising multiple sub-portions extending upwards or downwards from the first side; and
a second magnetic-field-sensing layer, not parallel to the surface of the substrate, comprising multiple sub-portions extending upwards or downwards from the second side of the horizontal magnetoresistive layer and magnetically coupled thereto.

24. The magnetoresistive sensing device according to claim 23, wherein the sub-portions of the first magnetic-field-sensing layer and the sub-portions of the second magnetic-field-sensing layer are disposed alternatively or symmetrically along the extending direction of the horizontal magnetoresistive layer.

25. The magnetoresistive sensing device according to claim 22, wherein the multiple conductive portions of the first side and the multiple conductive portions of the second side are disposed alternatively or symmetrically along the extending direction of the horizontal magnetoresistive layer.

26. The magnetoresistive sensing device according to claim 22, wherein two of the resistive arms have same first magnetoresistive sensing components and the rest of the resistive arms have same second magnetoresistive sensing components.

27. The magnetoresistive sensing device according to claim 26, wherein the conductive part of the first magnetoresistive sensing component and the second magnetoresistive sensing component comprises multiple conductive strips and an extending direction of each of the multiple conductive strips forms an acute angle with respect to the extending direction of the horizontal magnetoresistive layer.

28. The magnetoresistive sensing device according to claim 27, wherein the first magnetic-field-sensing layer of the first magnetoresistive sensing component is magnetically coupled to the horizontal magnetoresistive layer of the first magnetoresistive sensing component at the first side while the first magnetic-field-sensing layer of the second magnetoresistive sensing component is magnetically coupled to the horizontal magnetoresistive layer of the second magnetoresistive sensing component at the side.

29. The magnetoresistive sensing device according to claim 22, wherein when an external magnetic field parallel to the surface of the substrate is applied on the device, an output of the device does not change.

30. The magnetoresistive sensing device according to claim 22, wherein when an external magnetic field perpendicular to the surface of the substrate is applied on the device, an output of the device changes.

* * * * *